United States Patent [19]

Slemmer

[11] Patent Number: 5,289,475
[45] Date of Patent: Feb. 22, 1994

[54] SEMICONDUCTOR MEMORY WITH INVERTED WRITE-BACK CAPABILITY AND METHOD OF TESTING A MEMORY USING INVERTED WRITE-BACK

[75] Inventor: William C. Slemmer, Dallas, Tex.

[73] Assignee: SGS-Thomson Microelectronics, Inc., Carrollton, Tex.

[21] Appl. No.: 620,835

[22] Filed: Nov. 29, 1990

[51] Int. Cl.$^5$ .............................................. G11C 29/00
[52] U.S. Cl. ................................... 371/21.1; 365/201; 371/21.4
[58] Field of Search .................... 371/21.1, 21.4, 28; 324/527, 523, 158, 73 R; 365/201

[56] References Cited

U.S. PATENT DOCUMENTS

| | | |
|---|---|---|
| 4,251,876 | 2/1981 | McKenney et al. |
| 4,288,865 | 9/1981 | Graham |
| 4,567,389 | 1/1986 | van Tran |
| 4,618,785 | 10/1986 | van Tran |
| 4,771,407 | 9/1988 | Talemae et al. ............... 371/21.1 |
| 4,816,757 | 3/1989 | Hutchins ............... 324/158 |
| 4,820,974 | 4/1989 | Katsura et al. ............... 371/21.4 |
| 5,079,744 | 1/1992 | Tobita et al. ............... 371/21.1 |

FOREIGN PATENT DOCUMENTS 0234937  9/1987  European Pat. Off.
0399207  11/1990  European Pat. Off.

Primary Examiner—Vincent P. Canney
Attorney, Agent, or Firm—Rodney M. Anderson; Lisa K. Jorgenson; Richard K. Robinson

[57] ABSTRACT

An integrated circuit having a memory, and a method of operating the same, which provides for improved test efficiency. The memory includes static random access memory cells which power up in a preferred state; the preferred state draws less standby power, and is less susceptible to noise and other undesired effects which could cause upset of the stored data state. The method of testing the memory includes writing the memory cells with the complement of the preferred data state, so that all memory cells contain the higher current state; measurement of the standby current after the writing of the complement of the preferred data state will thus measure the worst case standby current. The method of testing may also include a disturb test, where the cell under test, or a neighboring cell in an adjacent row, is repeatedly accessed; such disturbing thus performs the worst case test, since the preferred state is more stable than its complement. Circuitry for performing the inverted write-back of the stored contents is also disclosed, so that such write-back may be performed without requiring read and write operations from the external terminals of the circuit.

4 Claims, 2 Drawing Sheets

SEMICONDUCTOR MEMORY WITH INVERTED WRITE-BACK CAPABILITY AND METHOD OF TESTING A MEMORY USING INVERTED WRITE-BACK

This invention is in the field of semiconductor integrated memory circuits, and is more specifically directed to methods of testing the same.

BACKGROUND OF THE INVENTION

Conventional integrated circuits that include randomly accessible memory, such circuits including both memory circuits such as static random access memories (sRAMs), and also microprocessors, logic arrays, and other very large scale integrated (VLSI) circuits having memory embedded therein, generally include an array or arrays of memory cells arranged in rows and columns. A portion of the memory address selects a row of memory cells, and a portion of the memory address selects one or more of the memory cells in the selected row for access thereof, either for reading data from or writing data to the addressed location.

Referring to FIG. 1, a conventional static RAM cell 26 in such an arrangement is illustrated. Cell 26 is constructed as a pair of cross-coupled inverters with resistor pull-ups. N-channel pull-down transistor 30a has its source-to-drain path connected between node SA and ground, and n-channel pull-down transistor 30b has its source-to-drain path connected between node SB and ground. Load devices 32a and 32b are connected between the power supply node $V_{cc}$, and nodes SA and SB, respectively. In the example of FIG. 1, load devices 32 are polysilicon resistors which provide extremely high resistance, for example on the order of 5 Teraohms. An example of such resistors and their construction is described in U.S. Pat. No. 4,251,876, incorporated herein by this reference. While FIG. 1 shows load devices 32a and 32b as resistors, it should be noted that conventional sRAM cells 26 are also constructed as full complementary metal-oxide-semiconductor (CMOS) cells, where load devices 32 are p-channel transistors having their source-to-drain paths connected between $V_{cc}$ and the cross-coupled nodes SA and SB, respectively, and their gates connected to the cross-coupled node opposite from their respective drains. It should be noted that the effects described hereinbelow have also been observed in such full CMOS cells.

Memory cell 26 is connected to complementary bit lines BL and BL_ by way of pass transistors 34, each of which are controlled by row line RL. Row line RL is driven, as is conventional in the art, by a row decoder which decodes the portion of the memory address for selecting a row in the memory device, and which energizes one of the row lines RL for the device responsive thereto. Pass transistors 34 thus place the selected memory cells in communication with the remainder of the memory device via bit lines BL and BL_.

In operation, memory cell 26 will be in one of two states. A first state is where transistor 30a is on, so that node SA is pulled to a voltage at or near ground; in this state, since node SA is at a low voltage, transistor 30b is off, and load device 32b pulls node SB to a voltage at or near $V_{cc}$. The second state is of course the opposite condition, where transistor 30b is on, so that node SB is near ground, with transistor 30a off so that node SA is near $V_{cc}$. During such time as pass transistors 34 are energized by row line RL, the stored data state at nodes SA and SB may be communicated to, or set by, conventional sense amplifiers and write circuitry via bit lines BL and BL_.

In the physical construction of memory cells such as cell 26 of FIG. 1, one of the two stored states will necessarily have a higher holding, or leakage, current than the other. Where the load devices 32 are extremely high resistance polysilicon resistors as in the case of FIG. 1, the difference in current will likely be due to differences in the off-state leakage currents for the transistors 30. For example, a small defect may be present for one of the transistors 30 which can cause junction leakage from the drain of a transistor 30 to the substrate. In addition, a defect may be present in the channel of one of transistors 30 which reduces its channel length, such that its sub-threshold source-drain leakage is much increased over nominal values. Each of these leakage mechanisms will tend to cause conduction from the drain node when the transistor 30 is in its off state. Accordingly, if one of the transistors 30 has such a defect, the standby current will be significantly greater for the state where the leaky transistor 30 is off than for the state where the leaky transistor 30 is on (and where the less leaky transistor 30 is off), perhaps by several orders of magnitude. It should be noted that the defect need not be of such magnitude as to cause a loss of functionality in order for a significant difference in the leakage current to be present for a memory cell. Indeed, in the manufacture of such memories, if defects are observed which cause non-functionality due to junction or source-drain leakage in one or more memory cells for some memories on the wafer, it is quite likely that smaller defects which are capable of causing significant leakage current will be present in other, functional, memories on the same wafer.

Other factors may also cause differences in the leakage current between the two potential data states. For example, defects in the resistors, or design and layout differences in the resistors, either of which affect such characteristics as their width, length, and doping concentration, and such other factors as the resistance of metal contacts to the polysilicon resistors, may also cause higher leakage current for one of the two data states. In addition, design and layout differences between the pull-down devices, or other types of defects in these transistors, will also affect the leakage current in the stored states. It should be noted that for other types of cells, including full CMOS cells, and also dual-port memory cells and FIFO cells, similar differences in the leakage currents for the two states will also be present.

An important consideration in static RAMs, dual-port RAMs, FIFOs, logic circuits with embedded memories, and in other integrated circuits which contain static memory cells such as memory cell 26 of FIG. 1, is the standby current drawn by the memory array. This is an especially important consideration for those circuits which are intended to be used in a battery back-up mode, i.e., where the stored data is to be maintained for long periods of time solely by the application of a bias voltage to the $V_{cc}$ power supply terminal from a battery. An example of a memory having battery backup capability is described in U.S. Pat. No. 4,288,865, incorporated herein by this reference. Accordingly, a low standby current is desired for such memories, and the manufacturers of circuits containing such memories generally perform manufacturing tests for each circuit in order to guarantee that the standby current specifications are met.

Since each memory cell 26 will have one state in which the leakage current is larger than for the other state, a distribution of standby current exists based upon the percentage of cells in the circuit which are in its high current state. FIG. 2 illustrates a distribution of standby current $I_{sb}$ versus the percentage of memory cells in a given circuit which are in the high current state. As is evident from FIG. 2, a minimum standby current level $I_{sbmin}$ exists where all memory cells are storing their low current state, and a maximum standby current level $I_{sbmax}$ exists where all memory cells are storing their high current state. It should be noted that the difference between $I_{sbmin}$ and $I_{sbmax}$ may be small for those memories in the manufacturing population which do not have cells with defects causing significant leakage in one data state. However, it has been observed that the manufacturing population of memory devices will generally include devices which exhibit data state dependency of standby current caused by defects of non-killing size which result in junction or sub-threshold source-drain leakage; the difference between $I_{sbmin}$ and $I_{sbmax}$ for such devices can be quite large. The worst case standby current level $I_{sbmax}$ for a given device must be below the standby current specification limit in order for it to meet all specifications.

Due to the defect driven nature of this leakage mechanism, it is not predictable which state (i.e., node SA high or node SB high) will be the high standby current state for a particular memory cell 26. This is because, for best performance, each memory cell 26 is designed to be as balanced as possible, so that the writing of data in one state does not take longer than the writing of data in the other state. Accordingly, since large changes in leakage current result from manufacturing defects, the data state which is the high current state will be random from cell to cell. Due to the random nature of these defects, the thorough and accurate measurement of $I_{sbmax}$ for an n-bit memory requires the measurement of $I_{sbmax}$ for $2^n$ data patterns, so that the pattern of data which has the highest standby current $I_{sbmax}$ is found and compared to the specification limit. Such testing is of course impracticable in high volume manufacturing testing.

Prior test methods have included the measurement of $I_{sb}$ for a small number of stored data patterns. For example, the memory may be written with all zeroes, all ones, checkerboard, and checkerboard complement, with the standby current $I_{sb}$ measured for each. Such testing will generally ensure that the standby current $I_{sb}$ has been measured, at least once, approximately near where 50% of the cells are in the high leakage current state, so that a standby current near the value $I_{sb50}$ is measured. Especially considering the random location and size of defects which affect the standby current, such a test will, at best, detect only those memories in the manufacturing population which have a high degree of defect dependent standby current. Accordingly, some circuits would not meet the standby current specification for their worst case, but will improperly pass conventional standby current tests.

Another important test for memories such as static RAMs is a disturb test. In a first type of disturb test conventionally performed on static RAMs, the memory cell under test is written to one state, followed by repeated reads of this cell. In a static RAM memory cell, especially where load devices 32 are high resistance value resistors, the coupling of voltages from the bit lines BL and BL_ through the pass gates to the nodes SA and SB, as occurs in read operations, can cause weak cells to be upset. In this test, after repeated read operations to the memory cell, its contents are compared against the value written in the first cycle, to determine if the repeated reads have upset the memory cell.

A second type of well-known static RAM disturb test includes repeated read operations to neighboring cells in an adjacent row, particularly in memory arrays where the ground connection may not be directly made for each memory cell. Local voltage drops in the path between the source of transistors 30 and ground due to the conduction of accessed memory cells can also cause upset of weak memory cells. Accordingly, the disturb test may be performed by writing a known state into a memory cell, repeatedly accessing its neighbors in an adjacent row, followed by reading the cell under test to determine if it has retained its written data state.

As described above relative to FIG. 1, the two data states available for a conventional sRAM memory cell 26 may not be symmetric, especially in the presence of a defect. If, for example, transistor 30b is defective such that its drain node (node SB) is leaking either to the substrate node of transistor 30b (at zero volts or below) or to the source of transistor 30b (at ground), the voltage at node SB will be pulled low by such leakage, which tends to turn off transistor 30a. Of course, if such leakage is excessive, the memory cell will not be able to be written to the data state where node SB is high. However, if the defect is only of such a size that the leakage is moderate, and if the memory cell is set to the state where transistor 30a is on and transistor 30b is off, the leakage of transistor 30b will cause the gate voltage at transistor 30a to be closer to the off state than normal. This will cause node SA, at the drain of transistor 30a, to be at a higher voltage than normal (i.e., closer to the threshold voltage of transistor 30b). With the gate of the off transistor 30b closer to its threshold voltage than normal, it is easier for noise, for example from bit line BL through pass transistor 34, to turn on transistor 30b and reset the memory cell state. The worst case for the disturb test thus corresponds to the data state where the leaky one of the transistors 30 is off, which also corresponds to the high standby current data state as discussed above.

As described above, it is not feasible to test each of the possible data patterns in a memory in order to ensure that the worst case condition is used in the disturb test, especially considering that the less stable state depends, in many cases, on the presence of random defects. This becomes even less feasible as the memory size increases, such as to 1 Mbit or larger. Accordingly, the worst case disturb test may not be tested for a particular memory device, allowing weak devices to pass the manufacturing tests.

Similarly, for purposes of measuring the soft error rate of such memories over time, the least stable condition is where all memory cells are in their high standby current data state. As soft error rate characterization is generally performed over relatively long periods of time, whether using an accelerated alpha particle source or in ambient system conditions, providing $2^n$ data patterns for such testing results in little time being spent in the worst case condition during the performance of the test.

It is therefore an object of this invention to provide an improved method of testing an integrated circuit including a memory array.

It is a further object of this invention to provide such a method which may be quickly performed in a special test mode.

It is a further object of this invention to provide a circuit having capability for such testing.

It is a further object of this invention to provide such a circuit and method which may be used to establish the worst case condition for the measurement of the standby current of a memory.

It is a further object of this invention to provide such a circuit and method which may be used to establish the worst case condition for disturb testing.

Other objects and advantages of the invention will be apparent to those of ordinary skill in the art having reference to this specification together with the drawings.

SUMMARY OF THE INVENTION

The invention may be incorporated into a method for testing an integrated circuit, and in a circuit having special test circuitry for efficiently performing such a method. According to the method, the memory is first powered-up, and the state of the memory cells after power-up is inverted, so that the high standby current state, and the less stable state, is set in the memory cells. The method utilizes the memory cell behavior in powering-up in the lowest current state, so that inverting the power-up state places the circuit in its highest standby current state. Once the inverted power-up state is set, such testing as measurement of the standby current, disturb testing, and soft error characterization may be performed. The invention may be incorporated into a circuit by way of circuitry which places complement data onto the bit lines from that read therefrom, so that the logical complement of the memory cell state may be written without requiring the external reading and writing of each memory cell.

DETAILED DESCRIPTION OF THE PREFERRED EMBODIMENTS

Figure 1:
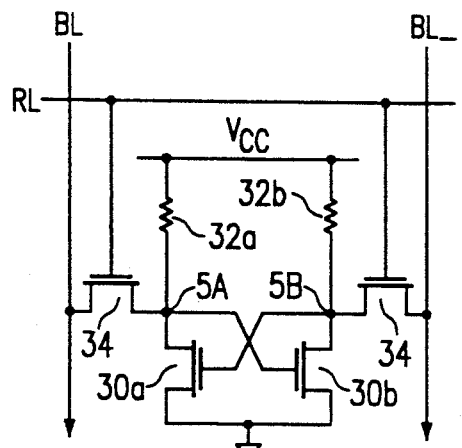
FIG. 1 is an electrical diagram, in schematic form, illustrating one type of a conventional static memory cell.
Figure 3:
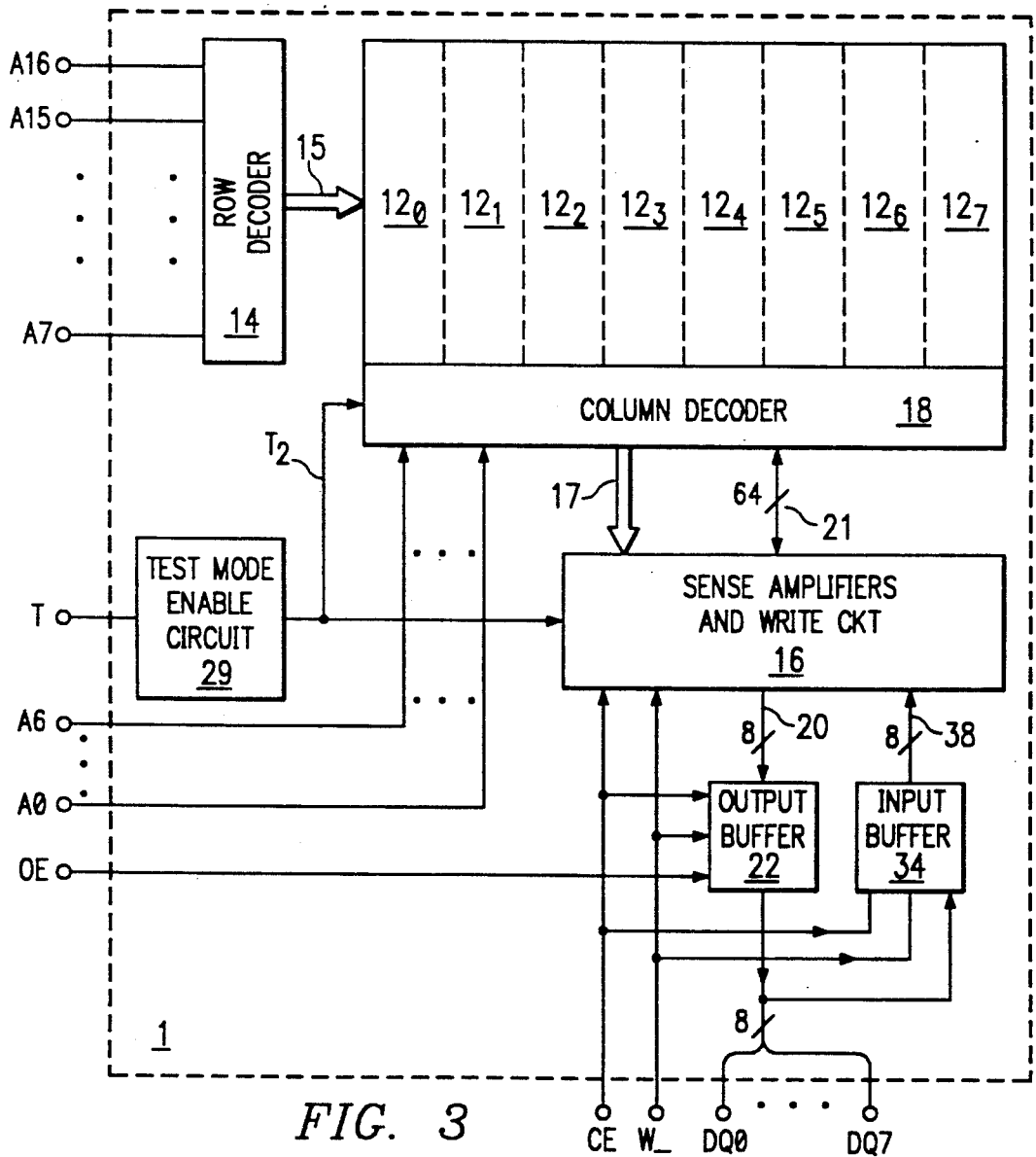
FIG. 3 is an electrical diagram, in block form, of a memory incorporating the preferred embodiment of the invention.

Referring now to FIG. 3, a memory 1 incorporating the preferred embodiment of the invention will now be described. Memory 1 is an integrated circuit memory, for example a static random access memory (SRAM), having $2^{20}$, or 1,048,576, storage locations or bits. Each of the bits corresponds to a memory cell 26 as shown in FIG. 1. Memory 1 in this example is a wide-word memory, organized as $2^{17}$, or 128k, addressable locations of eight bits each. Accordingly, for example in a read operation, upon the access of one of the memory locations, eight data bits will appear at each of eight input/output terminals DQ0 through DQ7. The electrical organization of memory 1, in this example, is therefore 1024 rows of 1024 columns, with eight columns accessed in each normal memory operation.

In this example of memory 1, the memory array is divided into eight sub-arrays $12_0$ through $12_7$, each of which have 1024 rows and 128 columns. Memory 1 includes seventeen address terminals A0 through A16, for receiving the seventeen address bits required to specify a unique memory address. In the conventional manner, the signals from these seventeen address terminals are buffered by address buffers (not shown). After such buffering, signals corresponding to ten of the address terminals (A7 through A16) are received by row decoder 14, for selecting the one of the 1024 rows in array 10 to be energized by row decoder 14.

FIG. 3 illustrates schematically the relative physical location of sub-arrays 12 relative to one another, and relative to row decoder 14. As shown in FIG. 1, the selection of a row of memory cells 26 in sub-arrays 12 is accomplished by row lines, one of which is driven from row decoder 14 according to the value of the row address at terminals A7 through A16. The energizing of a row line connects the contents of memory cells 26 to their corresponding bit lines BL and BL_, as shown in FIG. 1, in the conventional manner.

It is preferred, for purposes of reducing the power consumed during active operation, that only one of the sub-arrays 12 remains energized during each active cycle, with the selection of the sub-array 12 which remains energized determined by the desired memory address (i.e., three bits of the column address). This arrangement requires that all eight bits of the accessed memory location are to be located in the same sub-array 12. This scheme for the selection of the desired sub-array 12 is, of course, not essential for the practice of the instant invention.

Signals corresponding to the remaining seven address terminals (A0 through A6) are received by column decoder 18 to select one of sub-arrays 12, and to select the desired columns in the selected sub-array 12, responsive to the column address. While single lines are indicated for the communication of the address value to row decoder 14 and column decoder 18, it should be noted that, as in many conventional memories, both true and complement values of each address bit may alternatively be communicated from the address buffers to the decoders, for ease of decoding; further in the alternative, one of many predecoding schemes as are well known in the art may be used relative to row decoder 14 and column decoder 18.

In this arrangement, the bit lines for the selected columns are communicated, via local data bus 21, to sense amplifier and write circuitry 16. Sense amplifiers and write circuitry 16 senses and stores the data state of the selected columns communicated thereto on local data bus 21. In this embodiment, a sense amplifier is associated with each of the data terminals DQ for each of the sub-arrays 12; as a result, sixty-four sense amplifiers are provided in sense amplifiers and write circuitry 16 in this embodiment of memory 1, and the width of local data bus 21 is sixty-four bits. Accordingly, column decoder 18 selects eight columns from the selected sub-array 12 for communication with sense amplifiers and write circuitry 16, and also selects (via select bus 17) which of the sense amplifiers therein are to be enabled for sensing the data communicated thereto from the selected sub-array 12. It should be noted that many alternative and conventional arrangements and organization of sense amplifiers and write circuitry 16 relative to column decoder 18 may be utilized in memory 1 in such a manner as to benefit from the invention. Such arrangements include, for example, the assignment of one sense amplifier for each bit line pair so that each column is sensed in a read operation, with column decoder 18 selecting the desired sense amplifiers for communication with the data terminals DQ. A further alternative arrangement provides a single sense amplifier for each of the data terminals DQ, with column decoder 18 selecting, according to the column address, a bit line pair for communication with each of the sense amplifiers.

Output bus 20 and input bus 38 provide communication between sense amplifiers and write circuitry 16 and output buffers 22 and input buffers 34, respectively. Via select bus 17, column decoder 18 controls the communication of sense amplifiers and write circuitry 16 with output bus 20 and input bus 38 according to which sub-array 12 is selected. As noted hereinabove, memory 1 according to this embodiment includes common input/output terminals DQ, which receive input data in write cycles and which also present output data in read cycles. Output buffers 22 receive control signals from output enable terminal OE, write enable terminal W_, and chip select terminal CE, and are controlled in the conventional manner so as to present a high impedance state during write cycles, as indicated at write enable terminal W_, and during such times as signals at output enable terminal OE and chip select terminal CE indicate that the high impedance state is desired. Input buffers 34 similarly receive control signals from chip enable terminal CE and write enable terminal W_, and are controlled thereby in such a manner that input buffers 34 are responsive to receive data during write operations when the memory 1 is enabled from chip enable terminal CE. It should be noted that alternative organizations of memory 1 may also benefit from the instant invention, such alternatives including dedicated input and output terminals, and other or fewer control features for data communication between memory cells 26 and the terminals of the circuit.

As described above relative to FIG. 1, static memory cells, such as memory cells 26, store data by maintaining one of two latched data states. In each of these data states standby current is drawn through the one of the pull-down transistors 30 which is in the on, or conductive, state and the load device 32 which is connected in series therewith. This standby current provides for the maintenance of the stored data state, and is therefore a necessary component of the standby current drawn by memory 1 so long as the data is to be stored therein. For ideal memory cells 26, no standby current is drawn through the transistor 30 which is in the off state, or through its series load device 32 except to the extent necessary to maintain the gate of the cross-coupled transistor 30 in its on condition. However, as described hereinabove, a defect in the manufacture of the memory can provide a junction or sub-threshold leakage path for transistors 30 in certain memory cells which add to the standby current in the condition where the leaky transistor 30 is in its off state. As a result, significantly more leakage current is drawn in one of the stored states than in the other. Other factors, such as design and layout differences in the two sides of the memory cell 26, or other types of defects, can also cause a dependency of the standby current on the stored data state.

It has been observed that memory cells 26 will, on power-up, tend to store the state which has the lower standby current, which is also the more stable of the two states. This may be explained considering the example discussed above, where transistor 30b of FIG. 1 has a leakage path (either junction leakage or sub-threshold leakage) from its drain at node SB. As the $V_{cc}$ power supply powers up, the voltage at node SA will rise more quickly than will the voltage at node SB, due to the leakage from node SB. This will cause transistor 30b to turn on more quickly than transistor 30a, further pulling down the voltage at node SB toward ground and turning off transistor 30a. This latches memory cell 26 in the state where node SB is low and node SA is high. Accordingly, the preferred state on power-up is the state where the leaky transistor 30 is on and the less leaky transistor 30 is off, such a condition drawing the lower current of the two states because the leakage current is apparent only for a transistor 30 in its off state. As noted above, the more stable state is also that for which the leakier transistor 30 is in its on condition, so accordingly memory 1 thus tends to power-up into its most stable logic state.

Similar behavior occurs in other types of static memory cells, such as those with active p-channel pull-up transistors as loads, and including FIFO and dual port cells. It is believed that in such other types of memory cells, and also in other conditions for polysilicon resistor load cells which cause data state dependent standby current, the low standby current data state is the more stable state, and the state into which the memory cells tend to power up.

Figure 2:
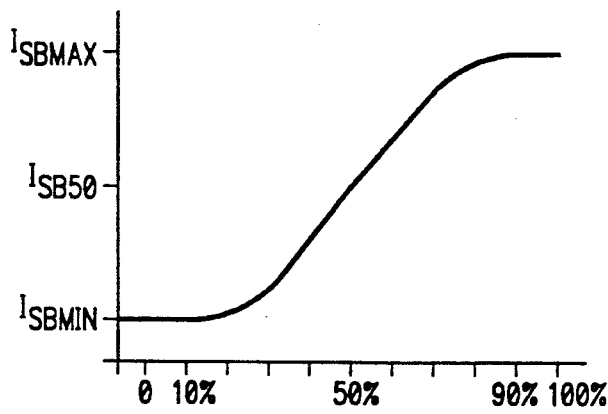
FIG. 2 is a plot of standby current versus the percentage of memory cells in the high current state in a conventional memory.

The methods of testing memories according to this invention take advantage of this observed behavior of powering-up into the lower standby current state, as will now be described. A first testing method according to the invention is the measurement of the worst case standby current. According to this embodiment of the invention, a first step in measuring the standby current is to power-down memory 1 (if memory 1 has been previously powered up) by turning off the $V_{cc}$ power supply for a time sufficient for internal nodes to discharge; alternatively, the standby current measurement according to this method may be performed as the first test after initial power-up. Memory 1 is then powered-up by the presentation of a nominal voltage on the $V_{cc}$ power supply. As noted above, this causes all of memory cells 26 in memory 1 to be set in the preferred, lower standby current, state. This places memory at or near its best case condition for standby current measurement (i.e., near the 0% point in FIG. 2).

In the method according to this embodiment of the invention, the worst case standby current data state is then set by inverting the data state of each of the memory cells 26 from that stored during power-up. For example, automated test equipment may be used to invert the data state, cell-by-cell, by performing a read cycle followed by a write cycle, or a read-modify-write cycle, for each memory location in memory 1; in either case, the state of each memory cell is read and written back with the logical complement of the state which was read. Alternatively, the contents of the entire memory may be read and stored, for example in memory of the automated test equipment, followed by writing back the logical complement of the stored data state into each of the memory cells 26 of memory 1. In either case, the contents of memory 1 are set to the logical complement of that which was stored therein upon power-up.

After writing the complement of the powered-up data state in memory 1, certain tests may now be performed. Firstly, after the inverting of each of the memory cells 26 by the reading of the powered-up state and the writing of the complement state therein, memory 1 is in its high standby current state, i.e., at or near the 100% point of FIG. 2, so that the standby current for this state is at or near the worst case standby current $I_{sbmax}$. Measurement of the standby current, by automated test equipment in the conventional way, will thus provide an accurate determination of the worst case standby current for the memory 1. Accordingly, the method according to this embodiment of the invention allows measurement of the standby current in the worst case condition, reducing the likelihood of passing circuits which do not meet the specification, and without requiring the application of a large number of patterns.

Also after inversion of the data states from power-up, whether performed instead of or after measurement of the standby current, disturb tests may be performed on in memory 1, as the memory cells 26 are each storing their less stable data state. A read disturb test may be done by repeatedly reading the memory cell 26 under test, with the tester storing the read contents from the first read operation. After performing the specified number of reads of the memory cell 26 under test, the data state last read are compared against the data state first read to determine if the memory cell 26 under test has changed state. If the memory cell 26 has been reset to the opposite state during the disturb, memory 1 has failed the test.

In addition, or alternatively, a conventional adjacent row disturb test may also be performed after the memory 1 has been set to its least stable condition. Such a test is especially useful for memory array configurations where multiple memory cells 26 have the sources of their transistors 30 connected in common, as in the well-known arrangement where a ground contact in the memory array is not made for each memory cell 26 but is made periodically in the array. In the adjacent row disturb test, once the memory cell 26 under test has been inverted from its power-up state and its contents read and stored by the automated test equipment, repeated read operations are performed to neighboring memory cells 26 in an adjacent row, particularly to cells having ground contacts in common with the memory cell 26 under test. After the specified number of disturb operations, the memory cell 26 under test is again read to determine if its state has been upset from the adjacent row read operations; if so, the memory has failed the adjacent row disturb test.

For purposes of soft error testing or characterization according to this embodiment of the invention, the worst case condition is also set by the writing of complement data from that on power-up. With all memory cells 26 in their less stable state, and after storing of this data pattern by the automated test equipment or other external memory, conventional accelerated testing by way of disposing an alpha particle source in proximity to memory 1 may be done. By reading the stored data state and comparing the same to the stored data state over time, the soft error failure rate may be extrapolated. Similarly, long term soft error testing may also be done in a system environment without the presence of the alpha particle source. Since all cells are in their less stable state, the measured or extrapolated error rate based on this method will be the worst case failure rate.

While the above testing methods may be applied to conventional memories, memory 1 of FIG. 3 includes additional circuitry which facilitates the writing of complement data from that stored in memory cells 26. This additional circuitry inverts data read from memory cells 26 in memory 1 without requiring communication of the read data to, and of the written data from, external terminals of memory 1.

Memory 1 includes test mode enable circuitry 29, which receives a signal from terminal T, and which presents a signal on line T2 to certain portions of memory in order to enable a special test mode. As described in copending application Ser. No. 552,567, filed Jul. 13, 1990, and in copending application Ser. No. 570,203, filed Aug. 17, 1990, both of said applications assigned to SGS-Thomson Microelectronics, Inc. and incorporated herein by this reference, special test modes are available for memories such as memory 1 in which operations may be performed which are not available in normal operating mode. Examples of prior special test modes include parallel read and write operations, as well as special tests directed to data retention time, tests of particular circuits within the memory such as decoders or sense amplifiers, and the interrogation of certain portions of the circuit to determine attributes of the device such as whether or not the memory has had redundant rows or columns enabled.

As described in said copending applications, the provision of a terminal T for receipt of a signal indicating entry into a special test mode may be used. Preferred methods for entry into test mode are described in said copending application Ser. No. 570,203, the use of which reduce the likelihood of inadvertent entry into test mode. It should be noted that the embodiment of FIG. 3, and the method of inverting the stored data of memory cells 26 described above and hereinbelow, may be enabled by any of the above-described methods for entry into test mode.

Line T2, as shown in FIG. 3, communicates a signal from test mode enable circuitry 29 indicating that the special test mode for inverting the contents of the memory cells 26 is enabled. Line T2, in this embodiment, is connected to column decoder 18 and to sense amplifiers and write circuit 16 for controlling the inverting of the stored data state in the manner described below.

Figure 4:
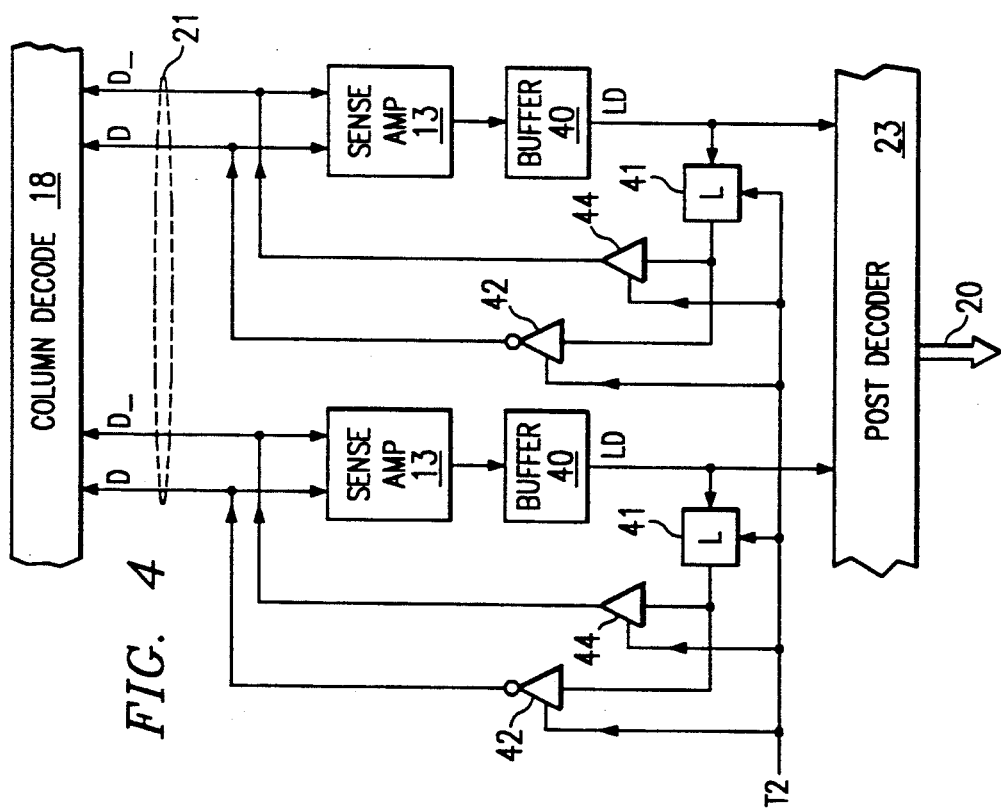
FIG. 4 is an electrical diagram, in schematic and block form, of a circuit in the memory of FIG. 3 directed to rewriting the memory cells therein.

Referring now to FIG. 4, a first embodiment of circuitry within sense amplifier and write circuitry 16 for performing inversion of the contents of memory cells 26, will now be described in detail. As shown in FIG. 4, individual sense amplifiers 13 receive a pair of lines from local data bus 21, such lines indicated as data bus lines D and D__, and carrying a differential signal indicative of the data state of the memory cell 26 in the selected row and a selected column. Each sense amplifier 13 senses the differential signal between data bus lines D and D__. The preferred construction of sense amplifier 13 is according to conventional dynamic sense amplifier design, including cross-coupled inverters connected between data bus lines D and D__, and an n-channel pull-down transistor with its source-drain path connected between the sources of the pull-down transistors of the cross-coupled inverters, and with its gate controlled by a sense clock signal. Examples of alternative sense amplifiers 13 are described in U.S. Pat. Nos. 4,618,785 and 4,567,389, both incorporated herein by this reference. It should be noted that the example of FIG. 4 is for the architecture of FIG. 1, where a single sense amplifier 13 is associated with each data terminal DQ for each sub-array 12; lines of select bus 17 (not shown) from column decoder 18 control the enabling of each sense amplifier 13 to sense and latch the data state presented thereto.

The circuitry of FIG. 4 may alternatively be provided for the arrangement where a sense amplifier 13 is associated with each column of memory cells 26, and accordingly senses the differential signal between bit lines BL and BL_ shown in FIG. 1.

Each of sense amplifiers 13 is in communication with output bus 20, after buffering by buffer 40, via local data line LD and post-decoder 23. Post-decoder 23 is responsive to select bus 17 (not shown) from column decoder 18 to control the connection of the appropriate ones of sense amplifiers 13 to the output bus 20. Alternatively, post-decoder 23 may receive certain ones of the column address inputs and decode the same to control the communication of sense amplifiers 13 with output bus 20. In this example, local data line LD is a single line for communicating logic levels according to the data state sensed by its associated sense amplifier 13 in a read operation. Alternatively, local data lines LD may each consist of differential lines, as is conventional for some memory circuits in the art. According to this embodiment, the data state at local data line LD is non-inverting, relative to data line D, so that when data line D is at a high voltage relative to complement data line D_, local data line LD will be at a high logic level.

It should be noted that the write path (for normal write operations) is not shown in FIG. 4, such a write path being easily implemented into the circuitry of FIG. 4 according to conventional techniques, for example by way of conventional write drivers connected to data lines D and D_ in parallel with sense amplifier 13.

The example of FIG. 4 includes circuitry for inverting the state of data lines D and D_ when memory 1 is placed in the appropriate special test mode, as described above. For each sense amplifier 13, local data line LD is connected to non-inverting latch 41. Latch 41 is controlled by line T2, such that latch 41 receives and latches the state of local data line LD during a special test mode operation, and is isolated from local data line LD in other operations. The output of latch 41 is connected to the input of an inverting buffer 42, and a non-inverting buffer 44. The output of inverting buffer 42 is connected to true data line D, and the output of non-inverting buffer 44 is connected to complement data line D_. Each of buffers 42 and 44 are tri-state buffers, also controlled by line T2 from test mode enable circuitry 29 so as to be operable responsive to line T2 indicating that the special test mode associated with the inverted write-back operation is selected. During such time as this special test mode is not selected, buffers 42 and 44 are placed in a tri-state condition, so that their outputs present a high impedance state to data lines D and D_, respectively.

In the operation of a read mode, whether or not the special test mode for inverted write-back is enabled, sense amplifiers 13 are controlled by signals from conventional timing control circuitry (not shown), and from column decoder 18, as noted above, to sense and latch a data state corresponding to the differential signal on data lines D and D_. This data state is, of course, the data state stored by selected memory cells 26, communicated through, and selected by, column decoder 18. The data state sensed by sense amplifier 13 is communicated to buffer 40, in this embodiment, for communication to data output bus 20 via local data lines LD and post-decoder 23.

In the special test mode where line T2 indicates that the inverted write-back special test mode is to be performed, latch 41 operates to latch the data state of local data line LD, and to thereafter be isolated from local data line LD. The isolation of latch 41 is preferred so that latch 41 does not receive, latch, and present the inverted data state, which would result in oscillation of the circuit of FIG. 4. Also responsive to line T2 indicating that the inverted write-back operation is to be performed, buffers 42 and 44 are enabled to drive the state of data lines D and D_, respectively, according to the output of latch 41. Alternatively, a latching sense amplifier may be used, with local data line LD connected directly to the inputs of inverters 42 and 44, without requiring latch 41.

When enabled, inverting buffer 42 drives true data line D with the complement of the data state of local data line LD, and non-inverting buffer 44 drives complement data line D_ with the data state of local data line LD. Accordingly, buffers 42 and 44 will drive data lines D and D_ with the logical complement of the data state which they presented to sense amplifier 13. With the row line RL continuing to be energized for the selected row of memory cells 26, and with column decoder 18 allowing communication between the bit lines BL and BL_ of the selected column and the corresponding data lines D and D_, the complement data state of that previously read will thus be written into the selected memory cells 26. In this way, the circuit of FIG. 4 quickly accomplishes the inverted write-back of the sensed data state into the selected memory cell, without requiring communication with the external data input/output terminals DQ.

As noted above, an alternative architecture to that of FIG. 3 may provide a sense amplifier 13 associated with each column. In such an arrangement, the inverted write-back may be performed for each pair of bit lines BL and BL_ which are sensed, regardless of the value of the column address. In this alternative arrangement, the inverted write-back performed according to the circuit of FIG. 4 may be done simultaneously for all memory cells 26 associated with the selected row, i.e., in a manner which is not limited by the data word width of the input/output terminals, and in many fewer cycles.

Another alternative arrangement may involve the use of more sense amplifiers 13 in special test mode than are utilized in a normal memory operation. In this alternative, column decoder 18 may be controlled by test mode enable circuitry 29 so that all sub-arrays 12 and all sixty-four sense amplifiers 13 (in this example) are operable, so that the inverted write-back may be simultaneously performed for sixty-four memory locations, rather than eight, in a single cycle. Alternatively, a sixteen bit wide or thirty-two bit wide write-back operation may be performed by the enabling of sixteen or thirty-two sense amplifiers 13 (and two or four sub-arrays 12, respectively). In either of these alternatives, post-decoder 23 would preferably be controlled so that conflicting data would not be driven onto output bus 20. It should be noted that the selection of the number of sense amplifiers 13 to enable in this alternative arrangement will likely depend upon the active power dissipation that can be tolerated, as a large factor in the active power dissipation is the number of sense amplifiers that are enabled in each operation.

Figure 5:
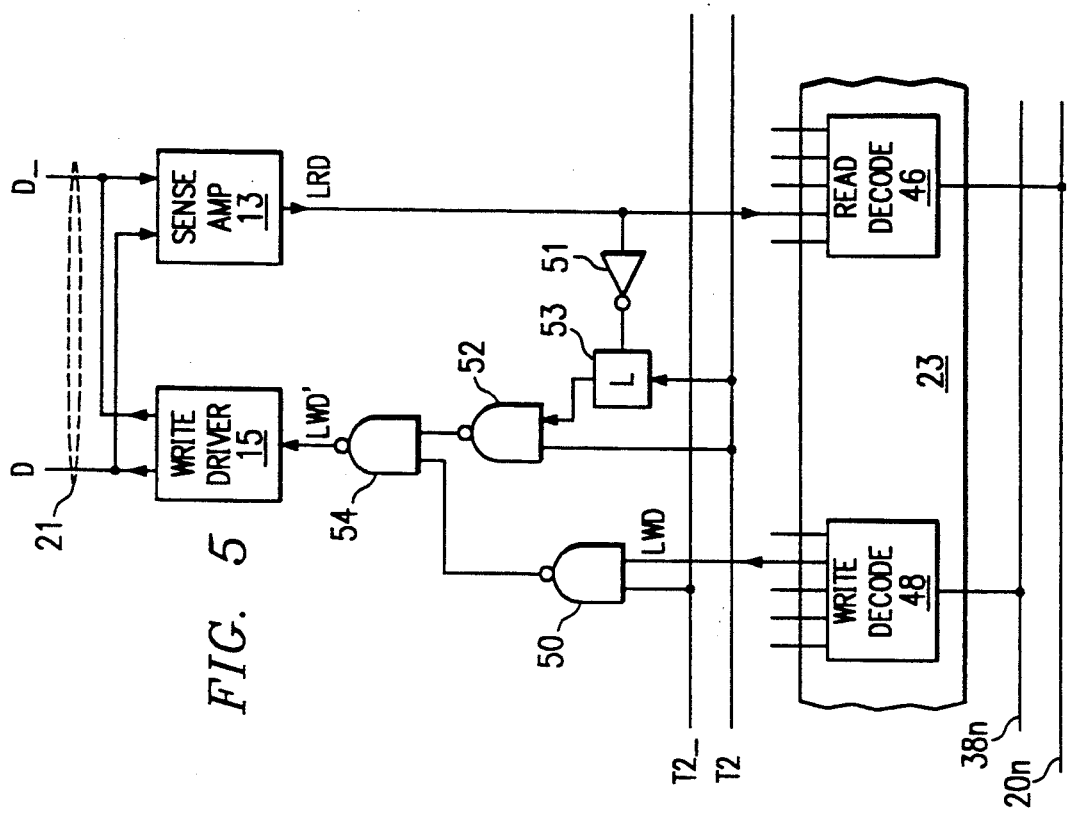
FIG. 5 is an electrical diagram, in schematic and block form, of an alternative embodiment of the circuit of FIG. 4.

Referring to FIG. 5, an alternative embodiment of sense amplifier and write circuitry 16 is illustrated for a single sense amplifier 13, including write driver 15 associated therewith for performing the inverted write-back and also for performing conventional writing of data. In a read operation in the alternative embodiment of FIG. 5, sense amplifier 13 presents to post-decoder 23 a logic state on local read line LRD which corresponds to the sensed differential signal on predecoded data lines D and D__. Local read line LRD is received by a read decoder 46 in post decoder 23, which selects one (or more, in the case of a wide word memory) of the local read lines LRD for communication to output bus 20 according to the value of the column address either directly presented to post-decoder 23, or via select bus 17 (not shown) from column decoder 18.

On the write side in this alternative embodiment, post-decoder 23 includes a write decoder 48, which connects input bus 38 to write circuits 15 via local write lines LWD, also corresponding to the value of the column address either directly decoded or communicated via select bus 17. Local write line LWD presents a logic level which corresponds to the data to be written into the selected memory cell 26. For purposes of this example, a high logic level LWD corresponds to the data state where true data line D is high relative to complementary data line D__. Local write line LWD is connected to one input of NAND gate 50, which has its other input connected to line T2__, which is the logical complement of line T2 issued by test mode enable circuitry 29 as described hereinabove. In this embodiment, line T2 is at a high logic level when the special test mode for the inverted write-back operation is selected; accordingly, normal operation (or a special test mode not using the inverted write-back) is indicated by line T2 at a low logic level and line T2__ at a high logic level.

Local read line LRD is connected to the input of a non-inverting latch 53 via inverter 51. Latch 53 is controlled by line T2, such that it is operable to sense and latch the output of inverter 51 in an inverted write-back operation, and is isolated from inverter 51 after such latching. Similarly as in the embodiment of FIG. 4, latch 53 guards against oscillation from the inverted write-back operation as would occur if the inverted state were read and inverted again. The output of latch 53, and line T2, are each connected to inputs of NAND gate 52.

The outputs of NAND gates 50 and 52 are connected to inputs of NAND gate 54, the output of which is connected to write driver 15 by local write line LWD'. Local write line LWD' communicates the data state to be written to the selected memory cell 26, with the same logic convention as described hereinabove relative to local write line LWD. Write driver 15 is a conventional tri-state write driver for driving a differential signal onto data lines D and D__ during a write operation and, in this embodiment of the invention, during operation in the inverted write-back mode.

In operation, when the inverted write-back special test mode is not selected, line T2 will be low and line T2__ will be high. A write operation is performed by write driver 15 of FIG. 5, responsive to write decoder 48 in post-decoder 23 connecting the input bus 38 to local write line LWD. With line T2__ high, NAND gates 50 and 54 will thus present the data state of local write line LWD on local write line LWD' (twice inverted by NANDs 50 and 54, so as to have the same logic level). Write driver 15 will place a differential signal on predecoded data lines D and D__ corresponding to the logic level on local write line LWD'. This state is communicated via column decoder 18 to the selected memory cell 26, in the conventional manner, to accomplish the writing of the data state thereinto.

In an inverted write-back operation, line T2 will make a transition to a high logic level and line T2__ to a low logic level. The low logic level on line T2__ forces a high logic level at the output of NAND gate 50, so that the circuit of FIG. 5 is not responsive to the data state of local write line LWD. The transition of line T2 will cause latch 53 to receive and latch the state of local read line LRD, inverted by inverter 51; latch 53 is then preferably isolated from inverter 51 as described above to prevent oscillation. Since line T2 is at a high logic level, NAND gate 52 presents an output corresponding to the state of local read line LRD (twice inverted by inverter 51 and NAND gate 52). This state is communicated to write driver 15 via NAND gate 54 which, due to the output of NAND gate 50 being high, is responsive to the output of NAND gate 52. These three inversions of local data line RLD cause the complement of the data state read by sense amplifier 13 to be presented to data lines D and D__ by write driver 15. With the appropriate row line RL continuing to be energized, the circuit of FIG. 5 thus accomplishes the writing of the complement of the sensed data state into the selected memory cell 26 via column decoder 18, for this inverted write-back operation.

Similarly as described hereinabove for the circuit of FIG. 4, this accomplishes the inverted write-back operation for the selected memory cells 26 without requiring communication of the read or complement data state to the external data input/output terminals DQ. Also similarly as discussed above relative to FIG. 4, alternative arrangements and control of sense amplifiers 13, write drivers 15, and column decoder 18 may allow wider operation, so that the number of cycles necessary for inverted write-back of the entire memory may be reduced.

In addition to the circuitry of FIG. 3, circuitry may be provided so that the inversion of the contents of memory 1 may be accomplished without requiring the presentation of external addresses thereto. For example, a row counter, similar to that used in dynamic RAMs for on-chip refresh operations, may be provided to store a row address value, and increment and sequentially present this value to row decoder 14. In such an arrangement, controlled by test mode enable circuitry 29, the contents of the row counter are communicated to the row decoder 14 for selection of a row without requiring the presentation of address values to terminals A7 through A16. A multiplexer is provided in the row decoder which allows for the selection of either terminals A7 through A16, or the contents of the row counter, to be decoded according to the mode in which the memory is placed.

This automatic presentation of row addresses may be useful in the testing methods using the inverted write-back operation described hereinabove, as the entire contents of memory 1 is to be inverted from that of power-up in the performing of such tests as worst case standby current measurement, and the disturb tests; in such inverted write-back of the entire contents, the value of the particular address being written back at any given time is not important, so long as the memory 1 is completely written back. It should be noted, however, that since the testing of sRAM and other memory devices is generally performed by the manufacturer of the device using conventional chip-level automated test equipment, it is preferred in this embodiment that the row address counter not be included on-chip in the memory, saving the chip area of the counter and its associated logic. The provision and use of such row counters is therefore most applicable for memories embedded within logic circuits such as microprocessors, logic arrays, and the like, and such other memory applications where direct testing thereof from address terminals is not easily performed.

Referring to FIG. 3, and the alternative schemes of FIGS. 4 and 5, the inverted write-back operation described hereinabove is facilitated by the construction of memory 1. Such inverted write-back without communication of the read and written data states to and from the external input/output terminals is especially useful in writing the complement of the data state in which memory cells 26 power-up, for such tests as standby current measurement, disturb testing, and soft error characterization.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of testing a read/write memory in an integrated circuit, said memory including a plurality of memory cells arranged in rows and columns, comprising:
    applying a bias voltage to said memory, said plurality of memory cells each storing a preferred data state responsive to said applying;
    sensing the state of a first one of said plurality of memory cells; and
    rewriting the logical complement of the sensed state into said memory cell;
    wherein said read/write memory has a data output terminal;
    and wherein the state of said first one of said plurality of memory cells is not presented at said data output terminal as a result of said sensing step.

2. The method of claim 1, wherein each of said plurality of memory cells draws less current when storing the preferred data state than when storing the complement of said preferred data state;
    and further comprising:
    after said rewriting step, measuring the current drawn by said plurality of memory cells.

3. The method of claim 1, further comprising:
    after said rewriting step, accessing said first one of said plurality of memory cells a plurality of times; and
    after said accessing step, comparing the contents of said first memory cell to the data state written in said rewriting step.

4. The method of claim 1, further comprising:
    after said rewriting step, accessing, a plurality of times, a memory cell in a row adjacent to that of said first one of said plurality of memory cells; and
    after said accessing step, comparing the contents of said first memory cell to the data state written in said rewriting step.

* * * * *